(12) United States Patent  (10) Patent No.: US 8,766,535 B2
Sonoyama et al.  (45) Date of Patent: Jul. 1, 2014

(54) ELECTRO-OPTICAL APPARATUS, MANUFACTURING METHOD THEREOF, AND ELECTRONIC DEVICE

(75) Inventors: Takuya Sonoyama, Suwa-gun (JP); Shunichi Seki, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 896 days.

(21) Appl. No.: 12/752,619

(22) Filed: Apr. 1, 2010

(65) Prior Publication Data
US 2010/0271293 A1 Oct. 28, 2010

(30) Foreign Application Priority Data
Apr. 24, 2009 (JP) ................................. 2009-106045

(51) Int. Cl.
H01L 51/50 (2006.01)
H01L 51/56 (2006.01)
H01L 51/52 (2006.01)
H01L 27/32 (2006.01)

(52) U.S. Cl.
CPC ......... H01L 51/52 (2013.01); *H01L 2251/5338* (2013.01); *H01L 27/3244* (2013.01)
USPC ............... 313/511; 313/506; 445/24; 445/25; 362/103

(58) Field of Classification Search
USPC ................. 313/500–512; 445/24, 25; 362/103
See application file for complete search history.

(56) References Cited

U.S. PATENT DOCUMENTS

| | | | |
|---|---|---|---|
| 6,697,191 B2 * | 2/2004 | Kiryuschev et al. | 313/505 |
| 7,144,830 B2 * | 12/2006 | Hill et al. | 442/301 |
| 7,324,071 B2 * | 1/2008 | Carpinelli et al. | 345/1.1 |
| 7,592,276 B2 * | 9/2009 | Hill et al. | 442/301 |
| 2002/0074937 A1 * | 6/2002 | Guberman et al. | 313/511 |
| 2003/0162312 A1 | 8/2003 | Takayama et al. | |
| 2003/0222334 A1 | 12/2003 | Ikeda et al. | |
| 2007/0018170 A1 | 1/2007 | Jeong et al. | |
| 2008/0049437 A1 | 2/2008 | Takayama et al. | |

FOREIGN PATENT DOCUMENTS

| | | |
|---|---|---|
| JP | A-2000-133438 | 5/2000 |
| JP | A-2002-15858 | 1/2002 |
| JP | A-2003-229548 | 8/2003 |
| JP | A-2003-345267 | 12/2003 |
| JP | A-2004-281085 | 10/2004 |
| JP | A-2004-281086 | 10/2004 |
| JP | A-2005-308849 | 11/2005 |
| JP | A-2007-25620 | 2/2007 |
| WO | WO 9919858 A1 * | 4/1999 |

* cited by examiner

Primary Examiner — Mariceli Santiago
(74) Attorney, Agent, or Firm — Oliff PLC (57) ABSTRACT

An electro-optical apparatus includes a substrate and multiple pixels formed upon the substrate. The substrate is formed by interleaving multiple strip-shaped tape members configured of a resin.

11 Claims, 11 Drawing Sheets

ELECTRO-OPTICAL APPARATUS, MANUFACTURING METHOD THEREOF, AND ELECTRONIC DEVICE

BACKGROUND

1. Technical Field

The present invention relates to an electro-optical apparatus, a manufacturing method thereof, and an electronic device that includes the electro-optical apparatus.

2. Related Art

Electro-optical apparatuses such as liquid crystal display apparatuses, organic EL (electroluminescence) display apparatuses, and so on have a basic configuration in which two substrates are laminated together, and thus are often used in low-profile electronic devices such as flat-panel televisions.

In particular, organic EL display apparatuses employ organic EL elements, which are self-luminous devices, and thus are more useful in realizing low profiles than liquid crystal display apparatuses, which require light sources such as backlights or the like. Meanwhile, with flat-panel televisions, a trend toward larger screens (enlargement) is in full swing, and lighter weights are being demanded for such display apparatuses in order to improve the ability to handle the apparatuses. Here, using a resin substrate, which is lighter in weight than a glass substrate, for the material of the substrate can be thought of as a method for realizing lighter weights.

For example, JP-A-2002-15858 proposes an organic EL display apparatus in which organic EL elements are formed upon a plastic substrate that is in the form of a film. This document proposes that with such a display apparatus, a lighter weight can be achieved in the apparatus even in the case where the screen of the apparatus is enlarged.

However, although a resin substrate is lightweight, such a substrate is also flimsy and lacking in strength, and will thus sag under its own weight if enlarged; accordingly, a support member such as, for example, a metallic support frame is required, which is problematic in that the final apparatus is thick as well as heavy. To rephrase, there has been a problem in that past display apparatuses have lacked toughness.

On the other hand, a substrate that is too hard, as is the case with a glass substrate, is brittle and breaks easily, making it difficult to handle, and there has thus been demand for a certain amount of flexibility in such a substrate.

In other words, past display apparatuses have been problematic in that such apparatuses have had difficulty striking a balance between strength and flexibility. To rephrase, there is a problem in that it has been difficult to realize a display apparatus having a lightweight yet tough configuration.

SUMMARY

An advantage of some aspects of the invention is to provide the following application examples or embodiments.

APPLICATION EXAMPLES

An electro-optical apparatus according to an aspect of the invention includes a substrate and multiple pixels formed upon the substrate; the substrate is formed by interleaving multiple strip-shaped tape members configured of a resin.

Because the substrate of this electro-optical apparatus is formed by interleaving multiple strip-shaped tape members that are configured of resin, the substrate is tougher than a single-panel resin substrate due to the interleaved structure. Furthermore, even with the interleaved structure, the substrate is configured of tape members made of a resin, and thus lighter weights than glass substrates can be achieved.

Accordingly, it is possible to provide a display apparatus that strikes a balance between strength and flexibility. To rephrase, it is possible to provide a display apparatus that has both a lightweight and tough configuration.

Furthermore, it is preferable that when the surface of the substrate on which an image is displayed by the multiple pixels is taken as a display surface, the multiple pixels be formed at least in areas of the tape members that are exposed on the display surface side as a result of the interleaving.

Furthermore, it is preferable for spaces that are smaller than the widths of the tape members to be formed in the substrate as a result of the interleaving.

Furthermore, it is preferable for the interleave to be a square interleave or a twill-pattern interleave.

Furthermore, it is preferable for the multiple pixels formed in the exposed areas of the tape members to be driven for display on a tape member-by-tape member basis.

Furthermore, it is preferable for the multiple pixels to be formed of organic EL elements.

An electronic device according to another aspect of the invention is an electronic device that includes the aforementioned electro-optical apparatus.

A manufacturing method for an electro-optical apparatus according to another aspect of the invention includes forming multiple strip-shaped tape members configured of a resin, forming multiple pixels on each of the tape members, and forming a substrate by interleaving the tape members; and when the surface of the substrate on which an image is displayed by the multiple pixels is taken as a display surface, the multiple pixels are formed at least in areas of the tape members that are exposed on the display surface side as a result of the interleaving.

A manufacturing method for an electro-optical apparatus according to another aspect of the invention includes forming multiple pixels upon a resin plate in a predetermined pattern, cutting out multiple strip-shaped tape members from the resin plate, and forming a substrate by interleaving the tape members; and when the surface of the substrate on which an image is displayed by the multiple pixels is taken as a display surface, the multiple pixels are formed at least in areas of the tape members that are exposed on the display surface side as a result of the interleaving.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings. Note that the various drawings referred to hereinafter illustrate the various layers, components, and so on at a size that makes such layers and components easily recognizable, and thus the scale of the layers, components, and so on differs from the actual scale thereof.

First Embodiment

Outline of Display Apparatus

Figure 1:
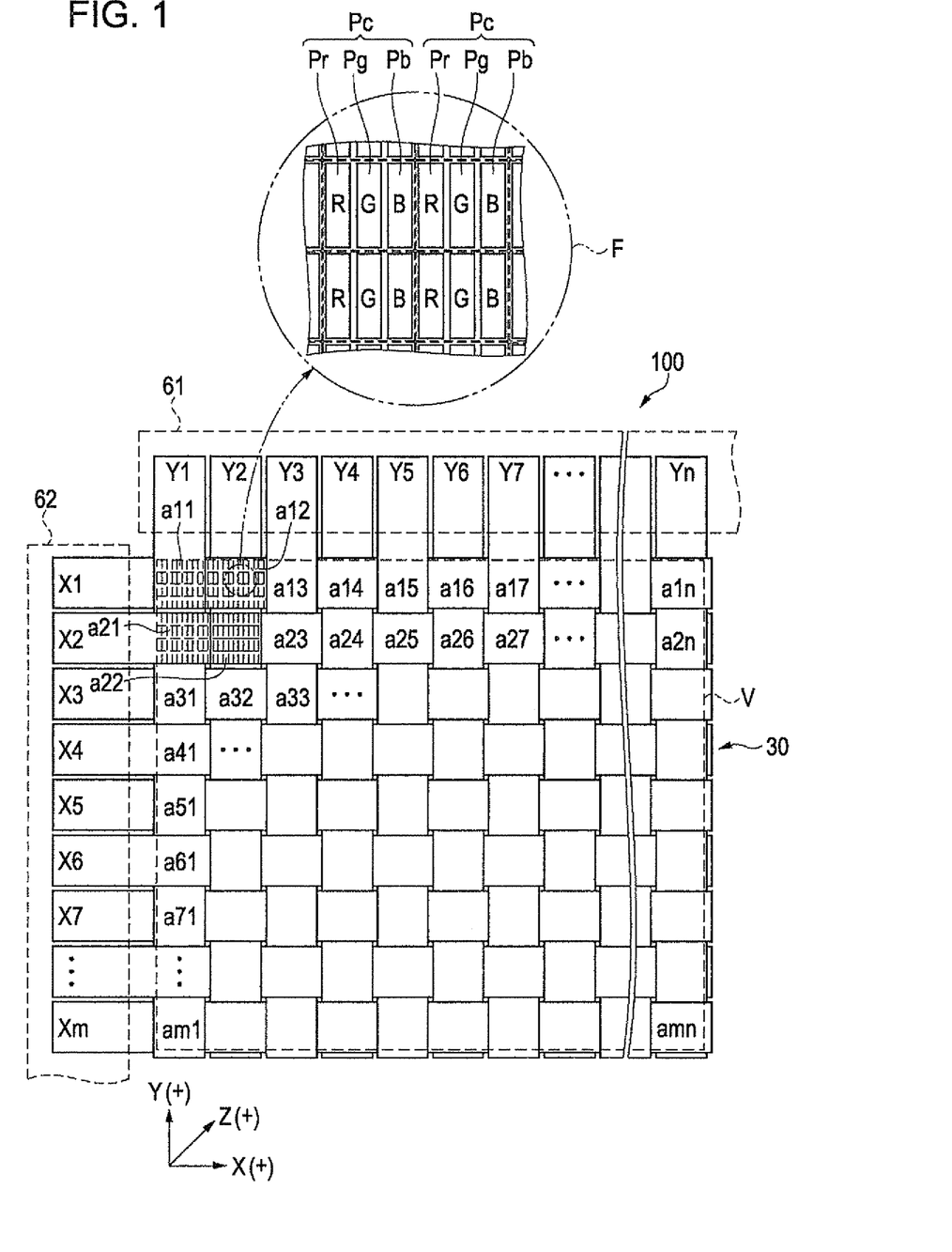
FIG. 1 is a plan view illustrating a display apparatus according to a first embodiment.

FIG. 1 is a plan view of a display apparatus according to this embodiment.

First, an outline of a display apparatus 100 serving as an electro-optical apparatus according to the first embodiment of the invention will be described.

The display apparatus 100 is an organic EL display apparatus, and a substrate 30, in which multiple strip-shaped tape members configured of a resin are interleaved, is employed as the substrate thereof. Note that the majority of FIG. 1 is a see-through diagram in which the pixels and so on formed on the surface layer of the substrate are not explicitly shown in order to facilitate understanding of the configuration of the substrate 30.

The display apparatus 100 is a bottom emission-type organic EL display apparatus, and includes an active-matrix rectangular-shaped display region V configured of multiple pixels P.

Each pixel P in the display region V is, as shown in the portion F (the upper portion of FIG. 1, enclosed in a circle) that illustrates an enlarged view of part of the display region V, rectangular in shape, and the width (short side) thereof is set to approximately ⅓ of the height (long side) thereof. A pixel array that is arranged in the short side direction is referred to as a "pixel row", whereas a pixel array that is arranged in the long side direction is referred to as a "pixel column".

A red pixel Pr, a green pixel Pg, and a blue pixel Pb are disposed in that order and in cycles thereof in the pixel rows. Meanwhile, pixels of the same color as the pixels in the uppermost pixel rows are disposed continuously throughout the pixel columns. A single color pixel Pc is formed by each sequence of three pixels Pr, Pg, and Pb in the pixel rows. Note that the pixels Pr, Pg, and Pb can be referred to as "sub pixels", whereas the color pixel Pc can simply be referred to as a "pixel". Furthermore, each pixel may be a monochromatic display instead.

Here, the illustrations included in FIG. 1 assume that the direction in which the pixel rows extend is the X axis (horizontal axis), whereas the direction in which the pixel columns extend is the Y axis (vertical axis). Furthermore, the thickness direction (depth direction) of the display apparatus 100 is defined as the Z axis.

The substrate 30 is formed by interleaving multiple tape members X1 to Xm that extend in the X axis direction with multiple tape members Y1 to Yn that extend in the Y axis direction, and the display region V is formed in an area in which the intersecting tape members have been interleaved.

Note that m and n are natural numbers. The multiple tape members X1 to Xm are disposed in stripe form at an approximately equal pitch in the Y axis direction, in a state in which one of the ends of those tape members are aligned. Likewise, the multiple tape members Y1 to Yn are disposed in stripe form at approximately equal pitch in the X axis direction, in a state in which one of the ends of those tape members are aligned.

Note that the multiple tape members X1 to Xm will be collectively referred to as "the tape members X" in the following descriptions. Likewise, the multiple tape members Y1 to Yn will be collectively referred to as "the tape members Y". Furthermore, the surface of the substrate 30 in which display light is emitted from the multiple pixels P, or in other words, the surface on which an image is displayed by the multiple pixels P, will be referred to as "the display surface".

The tape members X and the tape members Y are interleaved using what is known as a square interleave. Here, assuming that exposed regions of the tape members X and Y that are exposed on the display surface side as a result of the interleaving are taken as regions a, the display region V is configured of multiple regions a disposed in matrix form.

For example, the portions of the tape member X1 that intersect with tape members Y2, Y4, Y6, and so on are regions a12, a14, a16, and so on that are exposed on the display surface side. Likewise, the portions of the tape member X2 that intersect with the tape members Y1, Y3, Y5, and so on are regions a21, a23, a25, and so on that are exposed on the display surface side. In other words, areas where odd-numbered tape members X overlap even-numbered tape members Y are regions a, and areas where even-numbered tape members X overlap odd-numbered tape members Y are regions a.

Meanwhile, the portions of the tape member Y1 that intersect with the tape members X1, X3, X5, and so on are regions a11, a31, a51, and so on that are exposed on the display surface side. Likewise, the portions of the tape member Y2 that intersect with the tape members X2, X4, X6, and so on are regions a22, a42, a62, and so on that are exposed on the display surface side. In other words, areas where odd-numbered tape members Y overlap odd-numbered tape members X are regions a, and areas where even-numbered tape members Y overlap even-numbered tape members X are regions a.

In this manner, the substrate 30 is formed by interleaving the tape members X with the tape members Y on a one-by-one alternating basis, and thus regions a in the tape members X and regions a in the tape members Y are disposed so as to appear in an alternating manner in both the vertical and horizontal directions.

Furthermore, the pixels P in the tape members X and Y are selectively formed only in the regions a (details of this will be given later). To rephrase, pixels P are not formed in the areas of the tape members that are not exposed on the display surface, where another intersecting tape member is located thereabove.

In this manner, partial display regions configured of multiple pixels are formed in each region a, and the display region V is formed of a collection of multiple partial display regions (regions a). To rephrase, the display region V is configured of regions a11 to amn disposed in matrix form. The multiple pixels of which the display region V is configured are driven as an active matrix. Furthermore, the thickness of the tape members X and Y is approximately 0.5 mm, and thus although there is a slight unevenness in the display region V, the display region V is nevertheless formed essentially flat. Note that the display region V may be coated with a transparent resin in order to improve the degree of flatness thereof.

Meanwhile, a small space is formed between the regions a as a result of the interleaving (details will be given later).

The configuration is such that the ends of the tape members X and Y that are not interleaved protrude from the display region V. This protruding region is also called an "extended region". For example, the ends of the tape members X on the X axis (−) side protrude from the display region V. Likewise, the ends of the tape members Y on the Y axis (+) side protrude from the display region V.

Driving circuits for driving the display of the multiple pixels in the regions a are formed in the respective extended regions of the tape members X and Y. Furthermore, the extended regions are connected to respective flexible substrates 61 and 62, and the configuration is such that driving signals including image signals, driving timing signals, and so on are supplied to the tape members X and Y from the corresponding flexible substrates. More specifically, the extended region of the tape members X is connected to the flexible substrate 62, whereas the extended region of the tape members Y is connected to the flexible substrate 61. Note that the flexible substrates 61 and 62 are connected to, for example, an external device that supplies image signals.

Configuration of Tape Members

FIGS. 2A to 2D are enlarged plan views of the tape members. FIG. 3, meanwhile, is a circuit diagram illustrating pixel circuits and driving circuits.

Next, descriptions will be given regarding the configuration of the tape members X and Y of which the substrate 30 is configured and the circuit configurations.

Figure 2A:
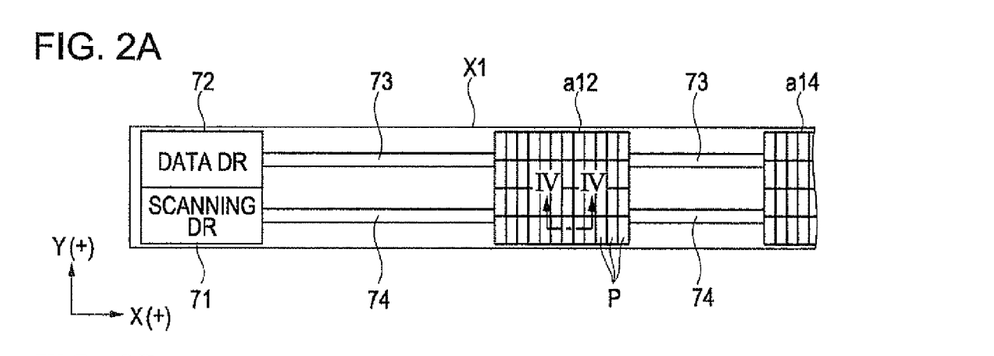
FIGS. 2A to 2D are enlarged plan views of a tape member.
Figure 3:
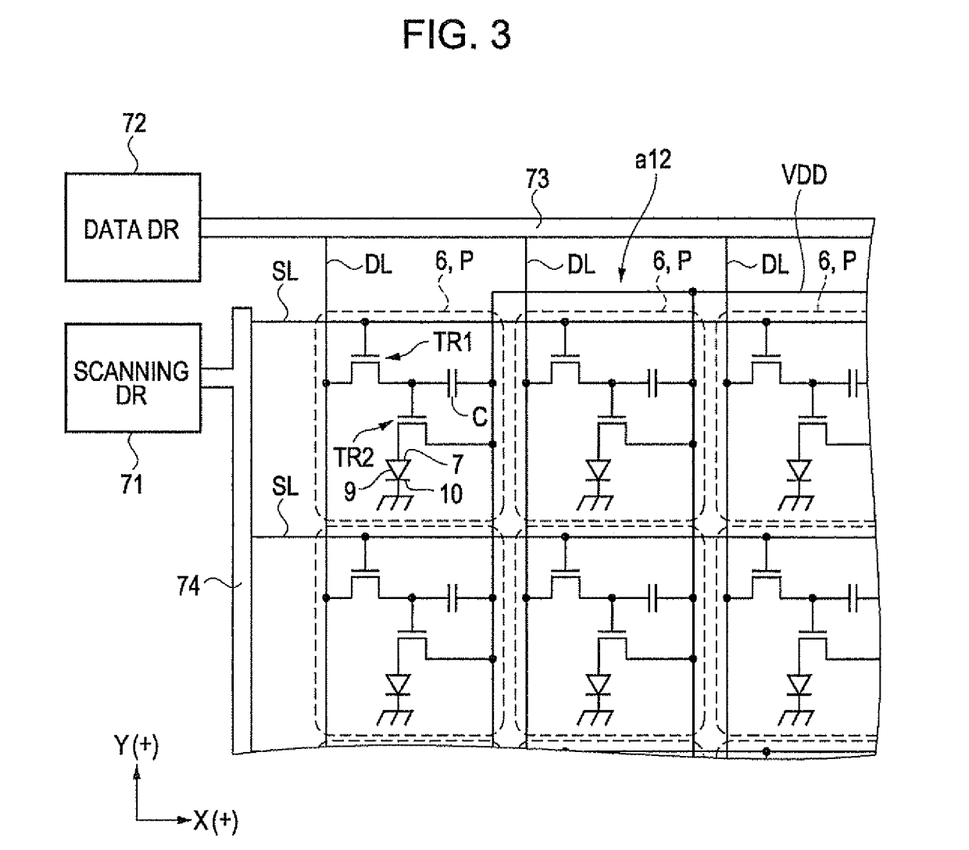
FIG. 3 is a circuit diagram illustrating pixel circuits and driving circuits.

FIG. 2A is an enlarged plan view of the tape member X1.

A scanning line driving circuit 71, a data line driving circuit 72, wiring portions 73 and 74, multiple regions a, and so on are formed in the tape member X1. The multiple regions a are formed at set intervals so that, after interleaving, the regions a12, a14, and so on are located in areas that are exposed on the display surface side. Furthermore, the direction in which the tape member X1 extends matches the direction in which the pixel rows in each region a extend. To rephrase, the direction in which the tape member X1 extends matches the short side direction of the pixels P. The scanning line driving circuit 71 and the data line driving circuit 72 are connected to the multiple regions a by the wiring portions 73 and 74.

FIG. 3 is a circuit diagram illustrating the scanning line driving circuit 71 and the data line driving circuit 72 as well as the wiring relationship between multiple pixel circuits 6 in the region a12. Note that the pixel circuits 6 are pixel circuits for driving the display of the multiple pixels P of which the region a12 is configured, and are formed on a pixel P-by-pixel P basis.

Each pixel circuit 6 is configured of a transistor TR1 that is a switching TFT (Thin-Film Transistor) for selecting the pixel, a transistor TR2 that is a driving TFT for supplying a current to an organic EL layer 9, and a holding capacitor C.

A scanning line SL is connected to the gate terminal of the transistor TR1, whereas a data line DL is connected to the source terminal of the transistor TR1.

The gate terminal of the transistor TR2 and one end of the holding capacitor C are connected to the drain terminal of the transistor TR1.

The source terminal of the transistor TR2 and the other end of the holding capacitor C are connected to a VDD line supplying a high-power potential. The drain terminal of the transistor TR2 is connected to a pixel electrode 7.

The organic EL layer 9 is disposed between the pixel electrode 7 and a common electrode 10. The common electrode 10, meanwhile, is connected to a ground line.

The wiring portions 73 and 74 are wiring regions in which multiple wires are disposed. The wiring portion 74 contains multiple scanning lines SL, and connects the scanning line driving circuit 71 with the multiple pixel circuits 6. Meanwhile, the wiring portion 73 contains multiple data lines DL, and connects the data line driving circuit 72 with the multiple pixel circuits 6. Note that the VDD line and the ground line are also included in the wiring portion 73 or the wiring portion 74.

Timing signals based on image signals from the flexible substrates 61 and 62 (FIG. 1) and data signals that define image content are supplied to the scanning line driving circuit 71 and the data line driving circuit 72.

The scanning line driving circuit 71 is configured so as to include a shift register, an output buffer, and the like (none of which are shown), and supplies sequential scanning signals to the multiple scanning lines SL based on the timing signals from the flexible substrates 61 and 62 (FIG. 1).

The data line driving circuit 72, meanwhile, is configured so as to include a shift register, a latch circuit, and the like (none of which are shown), and supplies data signals to the multiple data lines DL based on timing signals and data signals from an external device.

In the pixel circuits 6 formed in this manner, the transistor TR1 selected by a scanning signal turns on, and a data signal is supplied to the transistor TR2. As a result, the transistor TR2 turns on, and a current based on the voltage of the data signal flows from the VDD line to the organic EL layer 9, resulting in display light being emitted from a light-emitting layer. Meanwhile, the data signal is held in the holding capacitor C in parallel with the transistor TR2 turning on, and thus the light emission is maintained for an amount of time based on the capacitor.

The descriptions will now return to FIGS. 2A to 2D.

Figure 2B:
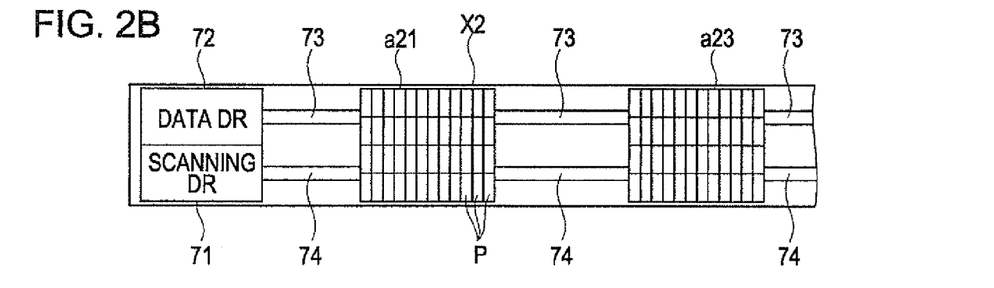

FIG. 2B is an enlarged plan view of the tape member X2.

As with the tape member X1, a scanning line driving circuit 71, a data line driving circuit 72, wiring portions 73 and 74, multiple regions a, and so on are formed in the tape member X2.

The tape member X2 differs from the tape member X1 in terms of the layout of the multiple regions a. The rest of the configuration is identical to the tape member X1. To be more specific, regions a21, a23, and so on are formed in the tape member X2 in areas corresponding to where the wiring portions 73 and 74 are formed in the tape member X1. To rephrase, if the tape member X1 and the tape member X2 are laid out side-by-side with their ends aligned, the regions a12, a14, and so on and the regions a21, a23, and so on are in a positional relationship in which they zigzag along the direction in which the tape members extend.

Note that although the tape member X1 and the tape member X2 are described here as examples, the odd-numbered tape members X have the same configuration as the tape member X1. Likewise, the even-numbered tape members X have the same configuration as the tape member X2.

When multiple odd-numbered tape members X and multiple even-numbered tape members X having such a configuration are arranged in the Y axis direction in an alternating manner with their ends aligned, as shown in FIG. 1, the multiple regions a are disposed in a checkmark form.

Figure 2C:
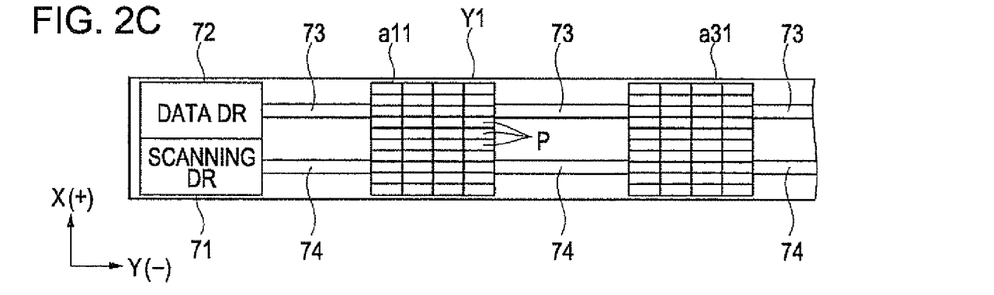

FIG. 2C is an enlarged plan view of the tape member Y1. Note that in FIG. 2C, the tape member Y1 has been rotated 90° counterclockwise from the state in which it is disposed in FIG. 1, in order to compare the tape member Y1 with FIG. 2A.

As with the tape member X1, a scanning line driving circuit 71, a data line driving circuit 72, wiring portions 73 and 74, multiple regions a, and so on are formed in the tape member Y1.

The tape member Y1 differs from the tape member X1 in terms of the layout of the multiple regions a and the layout of the pixels within the regions a. The rest of the configuration is identical to the tape member X1. To be more specific, the direction in which the tape member Y1 extends is orthogonal to the direction in which the pixel rows in the regions a extend. To rephrase, the direction in which the tape member Y1 extends matches the long side direction of the pixels P. This configuration is used so that, as shown in FIG. 1, the layout of the pixels in the regions a11, a31, and so on is the same as the layout of the pixels in the tape members X when the tape members X are interleaved with the tape members Y (the tape member Y1). To rephrase, the configuration is such that long side direction of the pixels P in the tape members Y (the tape member Y1) and the long side direction of the pixels P in the tape members X match after the interleaving.

Meanwhile, although this will be described in detail later, the driving direction in which the display of the regions a11, a31, and so on is driven by the scanning line driving circuit 71 and the data line driving circuit 72 is from the X axis (−) direction to the X axis (+) direction and from the Y axis (+) direction to the Y axis (−) direction.

Figure 2D:
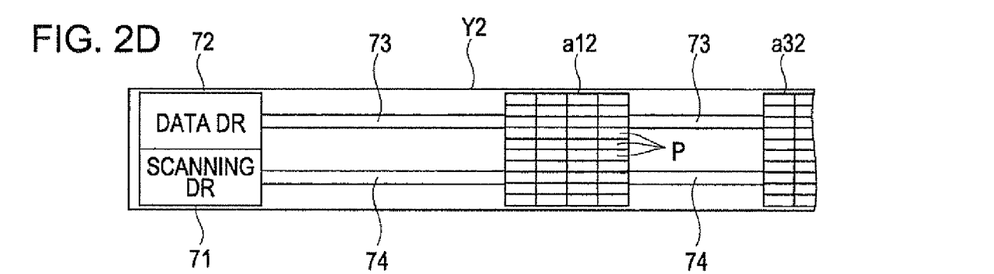

FIG. 2D is an enlarged plan view of the tape member Y2.

As with the tape member Y1, a scanning line driving circuit 71, a data line driving circuit 72, wiring portions 73 and 74, multiple regions a, and so on are formed in the tape member Y2.

The tape member Y2 differs from the tape member Y1 in terms of the layout of the multiple regions a. The rest of the configuration is identical to the tape member Y1.

To be more specific, regions a12, a32, and so on are formed in the tape member Y2 in areas corresponding to where the wiring portions 73 and 74 are formed in the tape member Y1. To rephrase, if the tape member Y1 and the tape member Y2 are laid out side-by-side with their ends aligned, the regions a11, a31, and so on and the regions a12, a32, and so on are in a positional relationship in which they zigzag along the direction in which the tape members extend.

Note that although the tape member Y1 and the tape member Y2 are described here as examples, the odd-numbered tape members Y have the same configuration as the tape member Y1. Likewise, the even-numbered tape members Y have the same configuration as the tape member Y2.

When multiple odd-numbered tape members Y and multiple even-numbered tape members Y having such a configuration are arranged in the X axis direction in an alternating manner with their ends aligned, as shown in FIG. 1, the multiple regions a are disposed in a checkmark form.

The display region V shown in FIG. 1 is formed by interleaving multiple tape members X and multiple tape members Y in a square pattern. To rephrase, the display region V is formed when the multiple regions a in a checkmark form within the array of multiple tape members X and the multiple regions a in a checkmark form within the array of multiple tape members Y are exposed to the display surface as a result of the interleaving. In other words, the multiple regions a in a checkmark form within the array of multiple tape members X and the multiple regions a in a checkmark form within the array of multiple tape members Y are in a complementary relationship.

Furthermore, because the driving direction of the display region V is, in FIG. 1, from the X axis (−) direction to the X axis (+) direction and from the Y axis (+) direction to the Y axis (−) direction, the driving directions in the tape members X and Y are in accordance therewith.

To be more specific, the scanning of the tape members X is driven in the direction in which the tape members X extend and toward the tape members X in the later stages. Meanwhile, the scanning of the tape members Y is driven in the width direction of the tape members Y and in the direction in which the tape members Y extend.

In other words, the driving direction of the tape members Y is rotated 90° counterclockwise with respect to the driving direction of the tape members X.

Configuration of Organic EL Elements

Figure 4:
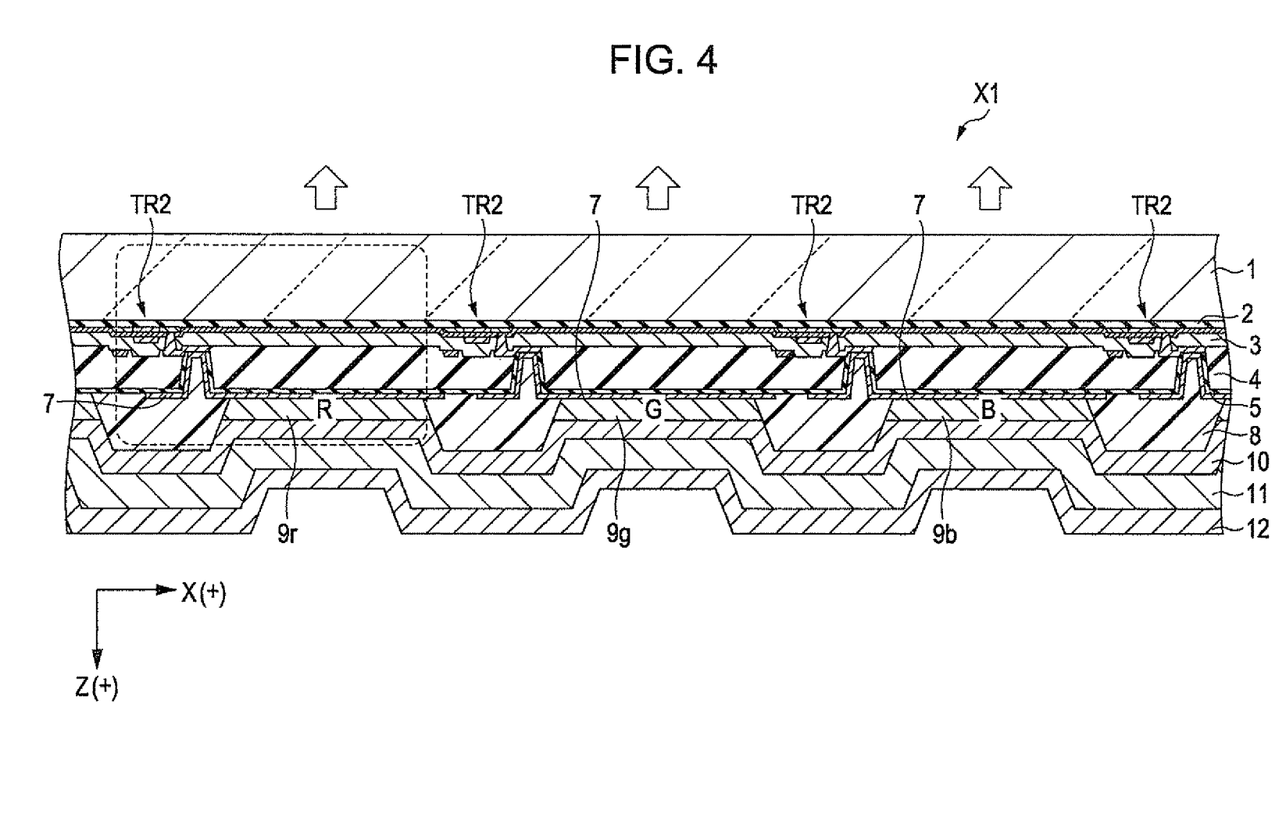
FIG. 4 is an enlarged view illustrating a cross-section of the tape member shown in FIG. 2A along a line IV-IV.

FIG. 4 is enlarged view illustrating a cross-section of the tape member shown in FIG. 2A along a line IV-IV.

Here, the cross-sectional configuration in regions of the tape member, or in other words, the configuration of organic EL elements will be described.

As shown in FIG. 4, the tape member X1 is configured of an element substrate 1, a protective layer 2, an element layer 3, a flattening layer 4, an insulating layer 5, pixel electrodes 7, partitions 8, organic EL layers 9 serving as electro-optical layers, a common electrode 10, a sealant layer 11, a barrier layer 12, and so on.

The element substrate 1 is a substrate configured of a transparent resin. In this embodiment, a polycarbonate resin film having a thickness of approximately 500 μm is used as a preferred example. Note that this thickness is not limited, and any thickness is acceptable as long as it provides the strength and flexibility required for interleaving. To be more specific, the thickness may be any thickness within the range of 50 μm to 1000 μm.

Furthermore, the material is not limited to polycarbonate resin, and any resin substrate may be used as long as it is transparent and lightweight. For example, polymethyl methacrylate resin, silicone resin, urethane resin, norbornene resin, fluoride resin, low-density polyethylene resin, polyester resin, or the like can be used. Alternatively, polyethylene terephthalate (PET), polyethylene naphthalate (PEN), polyethylene sulfone (PES), polyolefin (PO), polyimide (PI), polyethylene, polypropylene, cellophane, cellulose esters and derivatives thereof such as cellulose diacethylate, cellulose triacetate, cellulose acetate butyrate, cellulose acetate propionate, cellulose acetate phthalate, and cellulose nitrate, polyvinylidene chloride, polyvinyl alcohol, polyethylene vinyl alcohol, syndiotactic polystyrene, polymethylpentene, polyether ketone, polyether sulfone, polysulfones, polyether ketoamide, polyamide, nylon, polymethyl methacrylate, acrylics, polyarylate, or an organic-inorganic hybrid resin may be employed.

The protective layer 2 is a ground layer configured of $SiO_2$ or $Si_3N_4$ formed upon the element substrate 1.

The element layer 3 is a circuit element layer containing the aforementioned pixel circuits 6 (FIG. 3), and is formed upon the protective layer 2 through, for example, a decalcomania process. Note that the formation method is not limited to a decalcomania process, and any method that allows the element layer 3 to be formed upon the element substrate 1 may be employed. Meanwhile, the scanning line driving circuits and data line driving circuits are formed in the element layer 3 in the extended regions of the tape members. Note, however, that the circuits may be configured so as to be mounted on the surface of the extended regions, separate from the element layer 3.

Furthermore, a black-colored light-blocking layer is formed on the side of the element layer 3 that faces the protective layer 2 so as to overlap with the partitions 8 (mentioned later) when viewed from above. To rephrase, a black matrix is formed on the side of the element layer 3 that faces the protective layer 2.

The flattening layer 4, which is an insulating layer configured of an acrylic resin or the like, is formed as the layer above the element layer 3 (the Z axis (+) direction). The insulating layer 5, configured of $SiO_2$ or $Si_3N_4$, is formed as the layer above the flattening layer 4.

The pixel electrodes 7 are configured of transparent electrodes such as ITO (Indium Tin Oxide), ZnO, or the like, and are disposed discretely on a pixel-by-pixel basis. The pixel electrodes 7 are connected the drain terminals of the transistors TR2 in the element layer 3 on a pixel-by-pixel basis via contact holes that pass through the flattening layer 4.

The partitions 8 are configured of a light-curable black-colored resin, and separate the pixels into a grid when viewed from above. Note that the pixel circuits containing the transistors TR2 in the element layer 3 are disposed so as to overlap with the partitions when viewed from above, in order to prevent erroneous operations caused by light.

The organic EL layer 9 is selectively disposed in each pixel within regions enclosed by the partitions 8. Although only a single layer is illustrated in FIG. 4, in actuality, each organic layer is configured of an electron hole injection layer, an electron hole transport layer, a light-emitting layer, and so on configured of organic thin films, which are layered in that order upon the pixel electrodes 7.

As a preferred example, the height of the partitions 8 is set to be within the range of 1 μm to 3 μm, and the thickness of the organic EL layer 9 is set to be within the range of 0.05 μm to 0.2 μm.

In this embodiment, as a preferred example, red, green, and blue organic EL layers 9r, 9g, and 9b are formed through the shadow mask patterning method, using an ink jet technique that employs a high-polymer material. For example, in the blue organic EL layer 9b, PEDOT/PSS is used for the electron hole injection layer, TFB is used for the electron hole transport layer, and a polyfluorene derivative is used as the light-emitting layer. High-polymer materials that emit red and green are used for the red and green organic EL layers 9r and 9g, respectively.

Note that the layer structure is not limited thereto, and a configuration in which, for example, the electron hole transport layer is omitted from the aforementioned configuration may be employed as well. Alternatively, the configuration may provide an electron transport layer between the light-emitting layers and the common electrode 10. The configuration may then be such that an electron hole blocking layer is provided between the light-emitting layer and the electron transport layer. Furthermore, the configuration is not limited to a high-polymer material, and a low-polymer material may be employed instead. In such a case, the red, green, and blue organic EL layers 9r, 9g, and 9b are then formed through deposition.

The common electrode 10 is a cathode, and is a metallic electrode configured of a metal such has MgAg. In this embodiment, the layered structure from the protective layer 2 to the common electrode 10 that is defined by the partitions 8 when viewed from above, indicated by the dotted line in FIG. 4, is taken as an organic EL element (a pixel). Furthermore, although only the red pixel is illustrated as being surrounded by the dotted line as a representative example in FIG. 4, a similar organic EL element (pixel) is formed for the green and blue pixels as well.

The sealant layer 11 is a sealant layer configured of an ultraviolet light-curable or heat-curable resin. Resins such as, for example, epoxies, acrylics, urethanes, and so on can be employed. To improve the sealant qualities thereof, it is preferable to form the sealant layer 11 so as to be thick, and thus screen printing using a bar coater, a dispensing technique, or the like are favorable as manufacturing methods.

The barrier layer 12 is configured of a metal such as aluminum, chromium, gold, niobium, tantalum, titan, or the like, and is a barrier layer that prevents moisture from intruding into the organic EL layers 9. Note that the material of the barrier layer is not limited to metal, and any material that acts as a barrier against moisture may be used, including, for example, $SiO_2$ or $Si_3N_4$.

Display light corresponding to the colors of the organic EL layers 9 is emitted from the pixels configured in this manner, and passes through the element substrate 1; accordingly, a full-color image is displayed in the display region V as a result of the display light emitted from the multiple color pixels.

Note that the apparatus is not limited to the bottom emission-type, and may be a top emission-type apparatus in which light is emitted from the side on which the common electrode 10 is located. Furthermore, the apparatus may be an inorganic EL display apparatus provided with inorganic EL elements as its light source.

Outline of Manufacturing Method

Figure 5:
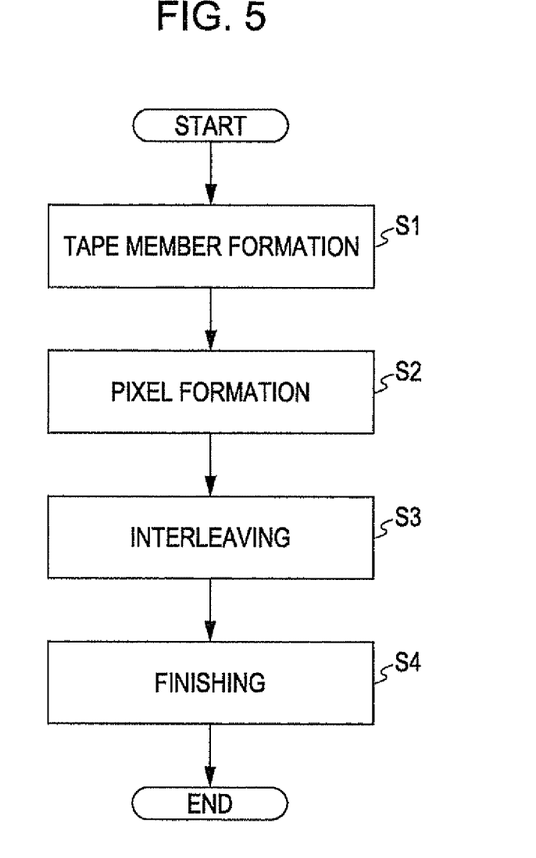
FIG. 5 is a flowchart illustrating the flow of a manufacturing method.

FIG. 5 is a flowchart illustrating the flow of a manufacturing method for a display apparatus according to this embodiment. Here, a manufacturing method for the display apparatus 100 configured as described thus far will be described with reference to the flowchart in FIG. 5.

In process S1 (hereinafter process Sn is referred to as Sn, n=1, 2, and so on) the tape members are obtained by cutting a large-sized polycarbonate film into strips, and the protective layer 2 and element layer 3 are formed on each tape member. Note that sputtering or plasma CVD (Chemical Vapor Deposition) is employed in the formation of the protective layer 2. A decalcomania process, meanwhile, is employed in the formation of the element layer 3.

In S2, the various layers including the organic EL layer 9 are formed upon the tape members. To rephrase, pixels are formed upon the tape members.

First, the flattening layer 4, partitions 8, and sealant layer 11 can be formed using a technique such as spin coating, spray coating, roll coating, die-coating, dispensing, screen printing, photolithography, or the like. A combination of these techniques may be used as well.

Meanwhile, the insulating layer 5, the pixel electrodes 7, the common electrode 10, and the barrier layer 12 can be formed using a technique such as sputtering, plasma CVD, photolithography, or the like. A combination of these techniques may be used as well.

The method for forming the organic EL layer 9b is as follows.

A 50-nm electron hole injection layer is formed by dispersing 3,4-polyethylene dioxythiophene, which is a polythiophene derivative, in polystyrene sulfonate, and then forming PEDOT/PSS obtained by dispersing these chemicals in water upon the pixel electrode 7 using the spin coat method.

A 20-nm electron hole transport layer is then formed by coating, using an ink jet method, the electron hole injection layer with a solution in which poly (2,7-(9,9-di-n-octylfluorene)-(1,4-phenylene-((4-methylphenyl) imino)1,4-phenylene-((4-methylphenyl)imino-1,4-phenylene) (TFB) has been dissolved in a xylene solution, and then heating the layer in a nitrogen atmosphere at 180° C. for one hour.

The electron hole transport layer is then coated with a blue light-emitting polyfluorene derivative using an ink jet method, and is then heated in a nitrogen atmosphere at 100° C. for thirty minutes, thereby forming a 60-nm light-emitting layer. The same type of organic functional layer is formed for the red and green organic EL layers 9r and 9g using high-polymer materials that emit red and green, respectively.

In S3, the multiple tape members X and tape members Y are interleaved, thereby forming the substrate 30. To rephrase, the multiple tape members X and tape members Y are interleaved in a square pattern. Accordingly, the display region V is formed by the regions a11 to amn of the tape members X and Y that are exposed on the display surface. In a preferred example, the interleaving is carried out using a dedicated interleaving apparatus. However, the interleaving is not limited to such a dedicated interleaving apparatus, and the interleaving may be carried out by hand.

In S4, a finishing process including a process of attaching the flexible substrates 61 and 62 is carried out. Note that a process for coating the display region V with a transparent resin in order to increase the degree of flatness thereof may be included in this finishing process.

Figure 6A:
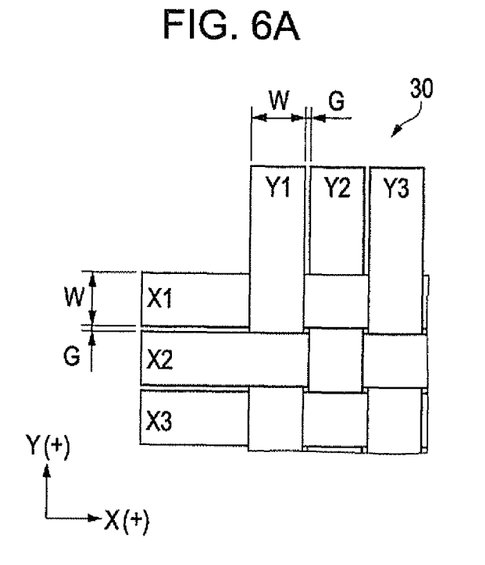
FIGS. 6A and 6B are diagrams illustrating states in an interleaving process.
Figure 6B:
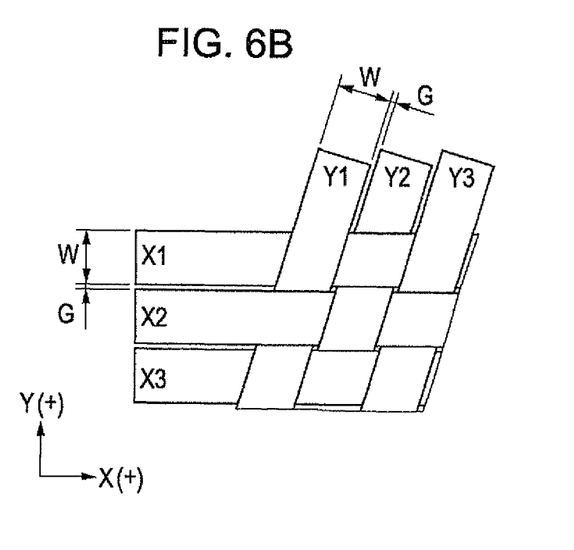

FIGS. 6A and 6B are diagrams illustrating states in the interleaving process.

As shown in FIG. 6A, the interleaving performed in the interleaving process of S3 ensures that a space G that is smaller than the width W of the tape members X and Y is formed between each tape member. To rephrase, a space G that is smaller than the width W of the tape members X and Y is formed in the interleaved substrate 30 as a result of the interleaving. The flexibility (and the degree of toughness) of the substrate 30 can be adjusted depending on the size of the space G. To be more specific, reducing the space G integrates the tape members X and Y, thereby increasing the strength of the substrate 30. Conversely, increasing the space G increases the degree of freedom with which the tape members X and Y can move.

In other words, a substrate 30 having the desired flexibility (and degree of toughness) can be formed by adjusting the space G in the settings for the interleaving.

Meanwhile, while the width of the tape members X and Y differs depending on the size of the display apparatus 100, a width W of no less than 2 mm is preferable from the standpoint of balancing the ability to interleave the tape members with the size of the regions a. Note that the widths of the tape members X and Y may differ from each other.

Note that the interleaving is not limited to a configuration in which the tape members X and the tape members Y are approximately orthogonal to each other, and the tape members may instead be slanted relative to each other. For example, the interleaving may be carried out in a state in which the tape members Y are slanted relative to the Y axis, as shown in FIG. 6B. Likewise, the tape members X may be in a state in which they are slanted relative to the X axis.

As described thus far, the display apparatus 100 and the manufacturing method thereof according to this embodiment can achieve the following effects.

Because the substrate 30 of the display apparatus 100 is formed by interleaving multiple strip-shaped tape members X and Y that are configured of resin, the substrate 30 is tougher than a single-panel resin substrate due to the interleaved structure. Furthermore, even with the interleaved structure, the substrate 30 is configured of tape members configured of a resin, and thus lighter weights than glass substrates can be achieved.

Accordingly, it is possible to provide a display apparatus 100 that strikes a balance between strength and flexibility. To rephrase, it is possible to provide a display apparatus 100 that has both a lightweight and tough configuration.

Meanwhile, according to the manufacturing method of this embodiment, the strip-shaped tape members are formed in S1, and the pixels are formed upon the tape members in S2. Then, the tape members X and Y are interleaved using a dedicated interleaving device in S3, thereby forming the substrate 30.

The substrate 30 can thus be formed in an efficient manner.

Accordingly, it is possible to provide a manufacturing method capable of efficiently manufacturing the display apparatus 100 that includes the interleaved substrate.

In particular, the interleaving performed in the interleaving process of S3 ensures that a space G that is smaller than the width W of the tape members is formed between each tape member. The flexibility (and the degree of toughness) of the substrate 30 can be adjusted depending on the size of the space G.

Accordingly, a substrate 30 having the desired flexibility (and degree of toughness) can be formed by adjusting the space G in the settings for the interleaving.

It is therefore possible to provide the display apparatus 100 having the desired degree of toughness.

Second Embodiment

Figure 7:
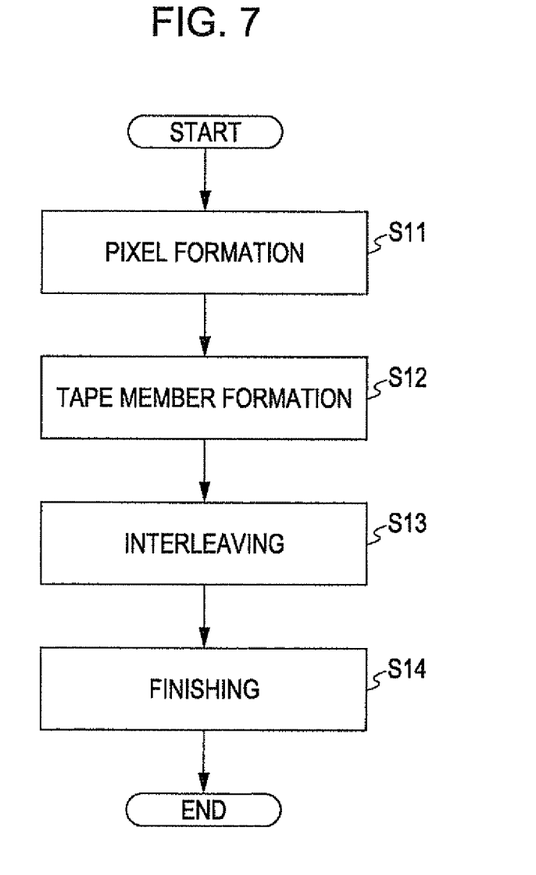
FIG. 7 is a flowchart illustrating the flow of a manufacturing method according to a second embodiment.
Figure 8:
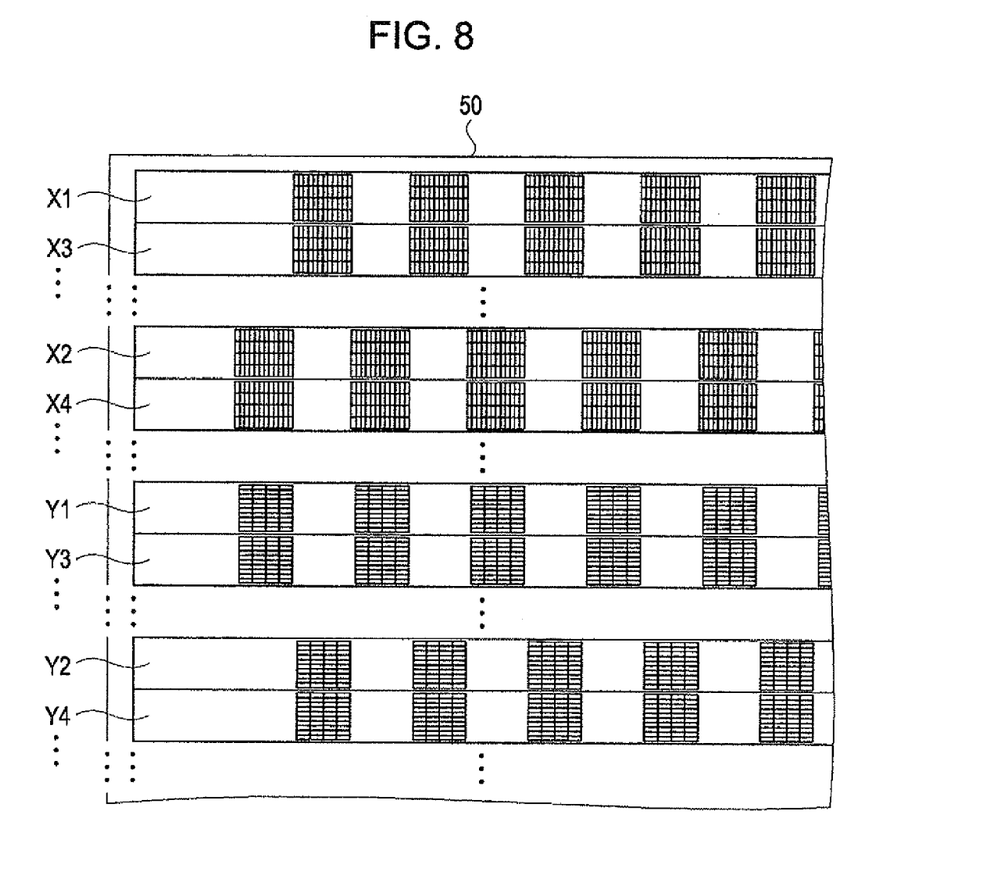
FIG. 8 is a plan view illustrating a large-sized substrate.

FIG. 7 is a flowchart illustrating the flow of the manufacturing method according to this embodiment, and corresponds to FIG. 5. FIG. 8, meanwhile, is a plan view illustrating a large-sized substrate, and corresponds to FIG. 2.

A manufacturing method according to the second embodiment of the invention will be described hereinafter using FIGS. 7 and 8. The manufacturing method according to this embodiment differs from the manufacturing method according to the first embodiment in that the method for forming the tape members X and Y is different. Aside from this, the manufacturing method is the same as that according to the first embodiment, including the completed state of the display apparatus 100 (substrate 30).

To be more specific, all of the tape members are formed as a large-sized substrate 50 configured of a single plate of resin, after which the tape members are cut out from the large-sized substrate, thereby forming the tape members X and Y. To rephrase, the tape members X and Y are formed by cutting out those tape members from the large-sized substrate 50 into which all of the tape members have been countersunk.

The following descriptions will focus on the method for forming the tape members X and Y, and descriptions identical to those given in the first embodiment will be omitted. Identical constituent elements will also be given identical reference numerals.

In S11, multiple pixels are formed in a predetermined pattern upon the large-sized substrate 50, which is a plate of resin. To be more specific, as shown in FIG. 8, multiple pixels are formed corresponding to respective regions a in order starting from the odd-numbered tape members X1, X3, and so on at the top, the even-numbered tape members X2, X4, and so on, the odd-numbered tape members Y1, Y3, and so on, and the even-numbered tape members Y2, Y4, and so on. Meanwhile, although not shown in FIG. 8, the scanning line driving circuits, data line driving circuits, and wiring portions are also formed upon the large-sized substrate 50. To rephrase, all of the tape members X and Y are created as the large-sized substrate 50. Note that the "predetermined pattern" is not limited to this order, and any pattern may be used as long as it includes all the tape members X and Y. Note also that the methods for forming a multiple pixels, the circuits, and the wiring may employ the methods described in the first embodiment. In S12, all of the tape members X and Y are then cut out from the large-sized substrate 50. To rephrase, the multiple tape members X and Y formed in the large-sized substrate 50 are cut out therefrom as individual units. Note that the cutout (cutting) can be carried out using a cutter such as a diamond cutter, cutting using a Thomson cutter, a pressing process using a press, and so on.

S13 is the same as S3 illustrated in FIG. 5. More specifically, the multiple tape members X and tape members Y are interleaved, thereby forming the substrate 30.

S14 is the same as S4 illustrated in FIG. 5. More specifically, a finishing process including a process of attaching the flexible substrates 61 and 62 is carried out.

According to the embodiment described thus far, the following effects can be achieved in addition to the effects achieved by the first embodiment.

According to the manufacturing method of this embodiment, all of the tape members X and Y are created as one large-sized substrate 50 that is configured of a single plate of resin, resulting in a positive manufacturing efficiency.

The substrate 30 can thus be formed in an efficient manner.

Accordingly, it is possible to provide a manufacturing method capable of efficiently manufacturing the display apparatus 100 that includes the interleaved substrate.

Electronic Device

Figure 9:
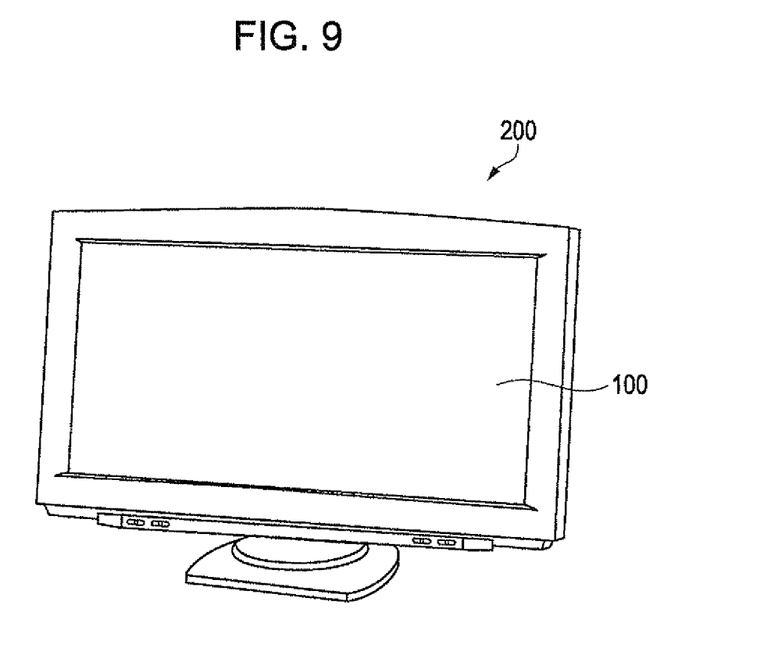
FIG. 9 is a perspective view illustrating a large-screen television as an example of an electronic device.

FIG. 9 is a perspective view illustrating a large-screen television provided with the aforementioned display apparatus.

The aforementioned display apparatus 100 can be used, for example, in a large-screen television 200 serving as an electronic device.

The large-screen television 200 includes the display apparatus 100 having, for example, a screen size of 42 inches, as its display screen. The large-screen television 200 is configured so as to be remotely operable using a remote controller (not shown), and images from various channels are displayed in the display apparatus 100 as a result of remote controller operations.

Because the display apparatus 100 is a self-luminous organic EL display apparatus, it can be configured so as to be thinner than a liquid crystal display apparatus, which requires a light source such as a backlight.

Furthermore, because the display apparatus 100 is configured using the interleaved substrate 30 (FIG. 1), which is lighter in weight and tougher than a glass substrate, the large-screen television 200 can be configured with a lower profile and a lighter weight. This large-screen television 200 is also superior in terms of impact resilience.

Accordingly, a low-profile and lightweight large-screen television 200 superior in terms of impact resilience can be provided.

However, the electronic device is not limited to a large-screen television, and the invention may be applied to any electronic device that includes a display unit, such as, for example, monitors, laptop computers, and so on. Various other electronic devices may be used as well, such as display devices for cellular phones and car navigation systems, PDAs (Personal Digital Assistants), mobile computers, digital cameras, digital video cameras, devices equipped in automobiles, audio devices, and so on.

Note also that the invention is not limited to the embodiments described above, and many variations and alterations thereof are possible as well. Such variations will be described hereinafter.

First Variation

Figure 10A:
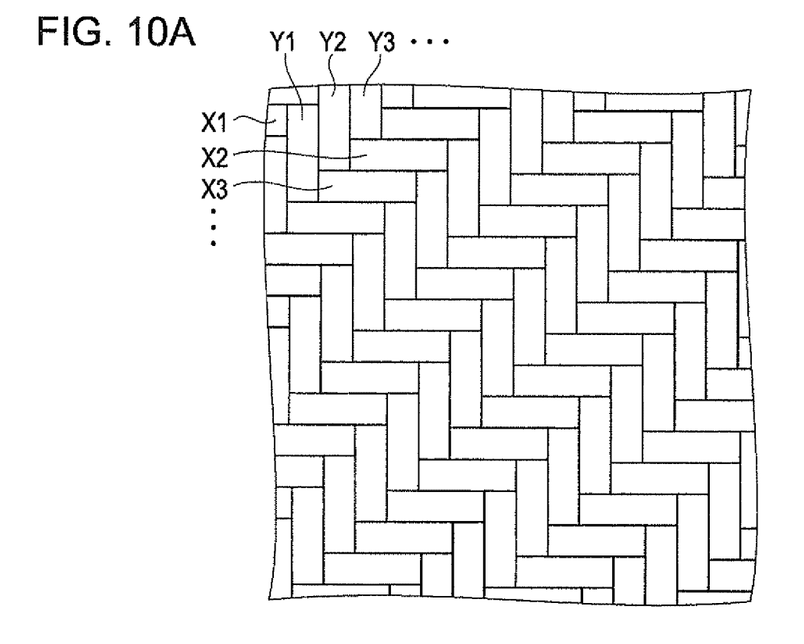
FIGS. 10A and 10B illustrate different states of interleaving according to a first variation.
Figure 10B:
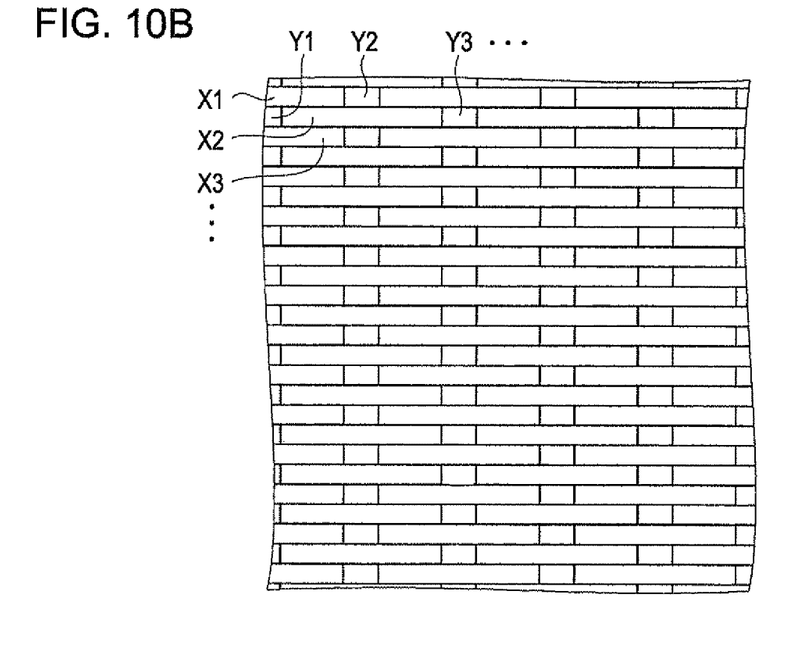

FIGS. 10A and 10B illustrate different states of interleaving according to a first variation. Although the aforementioned embodiments describe the interleaving method carried out during interleaving process as square interleaving, the interleaving method is not limited thereto, and any interleaving method that tightly interleaves the tape members may be used. For example, twill-pattern interleaving may be employed as the interleaving method, as shown in FIG. 10A. Twill-pattern interleaving is a method of interleaving in which the tape members Y are disposed so as to be packed together in the X axis direction; the tape members X, meanwhile, are interleaved so as to skip several tape members Y at a time, and the location of each mesh point is shifted (skewed) in the Y axis direction. The twill pattern is called 2/2 twill, 3/3 twill, and so on depending on the number of tape members Y that are skipped, and the example in FIG. 10A illustrates 3/3 twill-pattern interleaving.

Meanwhile, mat-pattern interleaving may be employed as the interleaving method, as shown in FIG. 10B. Note that mat-pattern interleaving is an interleaving method in which the tape members Y are disposed at equal intervals in the X axis direction with a space (gap) left therebetween, and the tape members X are interleaved thereinto while being packed in the Y axis direction. The interleaving process is the same as with square interleaving.

Note that when these interleaving method are used, it is preferable to take the areas exposed to the surface as a result of the interleaving as regions a and selectively form pixels in those regions, as described in the first embodiment.

The same effects as those described in the above embodiments can be achieved when using these interleaving methods as well.

Meanwhile, if, based on the specification, design, and so on of the display apparatus, gaps in the display region V due to the interleaving are permissible, interleaving methods such as hexagonal interleaving, asanoha (hemp leaf pattern) interleaving, tortoise-shell interleaving, kata-jime (half-closed) interleaving, and so on may be used, and the same effects as those described in the above embodiments can be achieved when using these interleaving methods as well.

Second Variation

Figure 11:
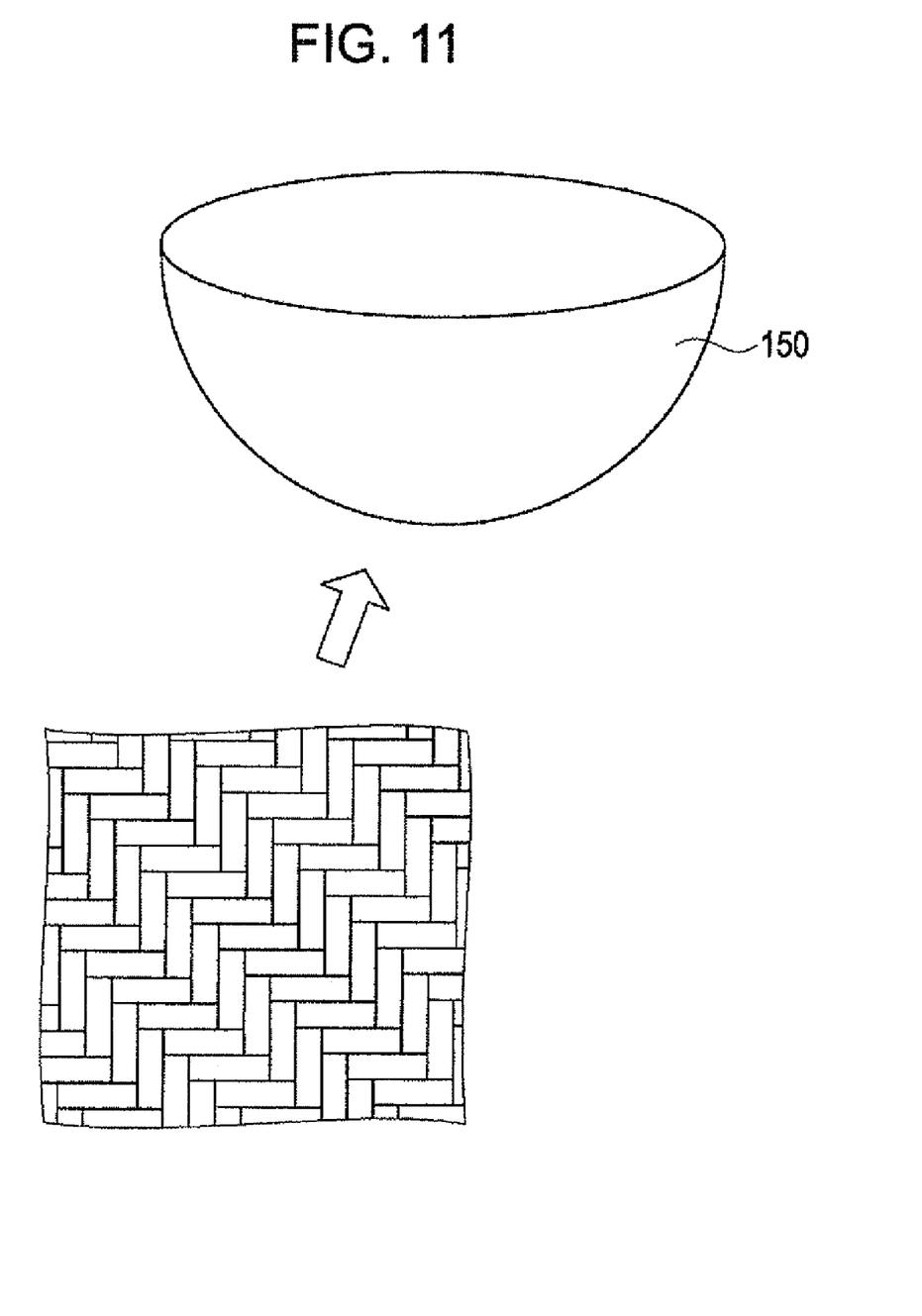
FIG. 11 illustrates an external view of a display apparatus according to a second variation.

FIG. 11 illustrates an external view of a display apparatus according to a second variation.

Although the above embodiments and variation describe the interleaved substrate as being flat in shape, the invention is not limited thereto, and a three-dimensional shape may be employed as well.

For example, as shown in FIG. 11, a hemispheric display apparatus can be formed by interleaving the substrate as a hemisphere. Note that FIG. 11 illustrates, as a preferred example, interleaving the substrate using a 2/2 twill pattern, which has positive form-following properties. Note that the shape is not limited to a hemisphere, and a cylindrical shape, a conical shape, and so on may be used as well.

Accordingly, a three-dimensional display apparatus can be realized by using an interleaved substrate, which has superior form-following and form-holding properties.

This variation is not limited to a display apparatus, and may be applied in, for example, an illumination apparatus as well. In this case, it is preferable to configure the regions a of a single passive-type light-emitting pixel that emits light of a single color. Applying the interleaved substrate to an illumination device makes it possible to form the illumination apparatus in a cylindrical, conical, or orb shape, which in turn makes it possible to provide an illumination apparatus with enhanced designability.

Third Variation

A third variation will be described using FIG. 1.

Although the above embodiments and variations describe the display apparatus 100 as being of the active matrix type, a passive matrix-type apparatus may be employed as well.

In this case, the pixel circuits 6 (FIG. 3) are unnecessary, and the configuration is such that the organic EL layers are held between scanning electrodes and data electrodes. Note that the scanning electrodes and data electrodes are formed extending in directions whereby the former intersect with the latter, thereby forming a grid when viewed from above.

Furthermore, although the display apparatus 100 is described as being an organic EL display apparatus in the above embodiments and variations, the display apparatus 100 is not limited thereto. For example, the display apparatus 100 may be an inorganic EL display apparatus, an electrophoretic display apparatus, or the like.

The same effects as those described in the above embodiments can be achieved in such a case as well.

The entire disclosure of Japanese Patent Application No. 2009-106045, filed Apr. 24, 2009 is expressly incorporated by reference herein.

What is claimed is:

1. An electro-optical apparatus comprising:
    a substrate with an active-matrix display region, the substrate being formed by interleaving multiple strip-shaped tape members configured of a resin;
    wherein (i) each of the multiple strip-shaped tape members includes a plurality of spaced apart partial display regions and a plurality of spaced apart non-display regions, (ii) each of the multiple strip-shaped tape members includes a scanning line driving circuit and a data line driving circuit, and (iii) each of the partial display regions includes a plurality of pixels that are controlled by the scanning line driving circuit and the data line driving circuit: and
    the active-matrix display region is formed by the plurality of partial display regions of the multiple strip-shaped tape members that are interleaved.

2. The electro-optical apparatus according to claim 1, wherein when the surface of the substrate on which an image is displayed by the multiple pixels is taken as a display surface, the multiple pixels are formed at least in areas of the tape members that are exposed on the display surface side as a result of the interleaving.

3. The electro-optical apparatus according to claim 1, wherein spaces that are smaller than the widths of the tape members are formed in the substrate as a result of the interleaving.

4. The electro-optical apparatus according to claim 1, wherein the interleave is a square interleave or a twill-pattern interleave.

5. The electro-optical apparatus according to claim 2, wherein the multiple pixels formed in the exposed areas of the tape members are driven for display on a tape member-by-tape member basis.

6. The electro-optical apparatus according to claim 1, wherein the multiple pixels are formed of organic EL elements.

7. An electronic device comprising the electro-optical apparatus according to claim 1.

8. The electro-optical apparatus according to claim 1, wherein the multiple pixels include at least a red pixel, a green pixel, and a blue pixel.

9. The electro-optical apparatus according to claim 1, wherein each of the interleaving multiple strip-shaped tape members includes a scanning line driving circuit and a data line driving circuit.

10. A manufacturing method for an electro-optical apparatus, the method comprising:
    forming an active-matrix display region;
    forming multiple strip-shaped tape members configured of a resin;
    forming multiple pixels on each of the tape members; and
    forming a substrate by interleaving the tape members,
    wherein (i) each of the multiple strip-shaped tape members includes a plurality of spaced apart partial display regions and a plurality of spaced apart non-display regions, (ii) each of the multiple strip-shaped tape members includes a scanning line driving circuit and a data line driving circuit, and (iii) each of the partial display regions includes a plurality of pixels that are controlled by the scanning line driving circuit and the data line driving circuit.

11. A manufacturing method for an electro-optical apparatus, the method comprising:
    forming an active-matrix display region;
    forming multiple pixels upon a resin plate in a predetermined pattern;
    cutting out multiple strip-shaped tape members from the resin plate; and
    forming a substrate by interleaving the tape members,
    wherein (i) each of the multiple strip-shaped tape members includes a plurality of spaced apart partial display regions and a plurality of spaced apart non-display regions, (ii) each of the multiple strip-shaped tape members includes a scanning line driving circuit and a data line driving circuit, and (iii) each of the partial display regions includes a plurality of pixels that are controlled by the scanning line driving circuit and the data line driving circuit.

* * * * *